United States Patent

Yamaguchi et al.

[11] Patent Number: 5,739,636
[45] Date of Patent: Apr. 14, 1998

[54] CADMIUM DISCHARGE LAMP OF THE SHORT ARC TYPE AND METHOD OF PRODUCING UV LIGHT THEREWITH

[75] Inventors: Akiyasu Yamaguchi; Yukio Yasuda; Hiromitsu Matsuno; Tatsushi Igarashi, all of Himeji, Japan

[73] Assignee: Ushiodenki Kabushiki Kaisha, Tokyo, Japan

[21] Appl. No.: 589,703

[22] Filed: Jan. 22, 1996

[30] Foreign Application Priority Data

Jan. 20, 1995 [JP] Japan ................. 7-024461

[51] Int. Cl.⁶ ........................................... H01J 61/12
[52] U.S. Cl. ................. 313/570; 313/568; 313/637; 313/638
[58] Field of Search .................. 313/570, 638, 313/642, 643, 641, 637

[56] References Cited

U.S. PATENT DOCUMENTS

| | | | |
|---|---|---|---|
| 3,234,421 | 2/1966 | Reiling | 313/571 X |
| 5,471,278 | 11/1995 | Yasuda et al. | 313/571 X |
| 5,481,159 | 1/1996 | Hiramoto et al. | 313/570 |
| 5,541,481 | 7/1996 | Yamaguchi et al. | 313/638 |
| 5,589,735 | 12/1996 | Yamaguchi et al. | 313/573 X |

*Primary Examiner*—Ashok Patel
*Attorney, Agent, or Firm*—Sixbey, Friedman, Leedom & Ferguson; David S. Safran

[57] ABSTRACT

A cadmium discharge lamp which can emit line spectra with wavelengths of 214±2 nm with high power is achieved by encapsulating metallic cadmium, in an amount producing a pressure in stationary lighting operation in the range from 2 kPa to 13.7 kPa, together with at least one of the rare gases xenon, krypton, argon and neon, in a temperature-controlled arc tube which is provided with electrodes located adjacently opposite one another, and by operating the lamp such that J/P is in the range from 1.4 to 75, where J is the discharge current in stationary lighting operation in amperes and the P is the cadmium pressure in stationary lighting operation.

4 Claims, 7 Drawing Sheets

CADMIUM DISCHARGE LAMP OF THE SHORT ARC TYPE AND METHOD OF PRODUCING UV LIGHT THEREWITH

BACKGROUND OF THE INVENTION

1. Field of the Invention

The invention relates to a cadmium discharge lamp of the short arc type.

2. Description of Related Art

Ultraviolet rays have different characteristics which are not exhibited by visible radiation and they are widely used for industrial applications. Recently, there has been a demand for a first-rate ultraviolet light source as a light source of an optical microscope which is combined with a CCD camera and which has high resolution.

In this case, the image resolution r of an optical microscope and the depth of focus DOF can be computed using the following formulas, if the numerical aperture of the optical system is designated NA and the wavelength designated $\lambda$.

$$r = K_1 (\lambda/NA)$$

$$DOF = K_2 (\lambda/NA)^2$$

$K_1$ and $K_2$ are coefficients which are determined by devices. It is, therefore, necessary to shorten the wavelength $\lambda$ in order to ensure the depth of focus and to increase the image resolution. To do this, ultraviolet rays, especially ultraviolet rays with still shorter wavelengths, instead of visible radiation (sunlight), are being reviewed for use as the light source.

For example, a technology using light with a wavelength of 313 nm is disclosed in the article P. A. Helmann and Urstadt, App. Opt. 29, No. 4,495 (1990) as one such light source. The resolution which is achieved in the case of using light with a wavelength of 313 nm for a microscope is, however, at most roughly 0.32 microns and has not recently been satisfactory as miniaturization continues to advance. The resolution which is specifically required is roughly 0.25 microns and light with a wavelength of roughly 214 nm is needed to achieve this resolution.

For this purpose, as a light source with a roughly 214 nm wavelength, a discharge lamp is suggested in which cadmium and rare gas, such as xenon, krypton, or the like, are encapsulated. Here cadmium ions as well as cadmium molecules are used and light with wavelengths from 210 nm to 230 nm is obtained. This technology is disclosed in Japanese unpublished patent specification HEI 7-21980 (U.S. Pat. No. 5,471,278).

This conventional lamp, however, emits continuous light at wavelengths from 210 to 230 nm. It may, therefore, be effective for applications in which continuous light is needed, however, in the case in which high resolution is needed, as in an optical microscope, it is not an especially effective light source.

SUMMARY OF THE INVENTION

A primary object of this invention is, therefore, to devise a cadmium discharge lamp by which line spectra with wavelengths of 214±2 nm can be emitted with high power.

Another object is to devise a light source which is suitable for an optical microscope with high resolution and for other applications.

These objects and others are achieved according to the invention by encapsulating metallic cadmium with a pressure in stationary lighting operation in the range from 2 kPa to 13.7 kPa together with a rare gas in which at least one of the rare gases xenon, krypton, argon or neon is chosen in a cadmium discharge lamp of the short arc type within a temperature-controlled arc tube which is provided with a pair of electrodes adjacently opposite one another, and by operating the lamp such that $1.4 \leq J/P \leq 75$, where J is the discharge current (in amperes) in stationary lighting operation and P is the cadmium pressure in stationary lighting operation (in kPa).

These objects are, furthermore, advantageously achieved according to the invention by the above described rare gas being encapsulated such that its pressure at room temperature is in the range from 50 kPa to 3 MPa.

These objects are, moreover, advantageously achieved according to the invention by there being no mercury encapsulated within the above described arc tube which contributes significantly to emission of light.

The inventors have found by their vigorous research that by fixing the cadmium pressure in stationary lighting operation and the current value in stationary lighting operation that light with wavelengths of 214 nm±2 nm can be emitted as line spectra with a small half-value width. They found that the light of these line spectra is based mainly on resonance lines of cadmium ions, and that the light reacts sensitively to changes of the cadmium pressure in stationary lighting operation and of the discharge current. They, furthermore, ascertained that it is advantageous that J/P is in the range from 1.4 to 75, where the current value in stationary lighting operation is designated J (in amperes) and where the cadmium pressure in stationary lighting operation is designated P (kPa), as becomes apparent from the embodiments described below relative to the several embodiments shown in the drawing.

DETAILED DESCRIPTION OF THE PREFERRED EMBODIMENTS

Figure 1:
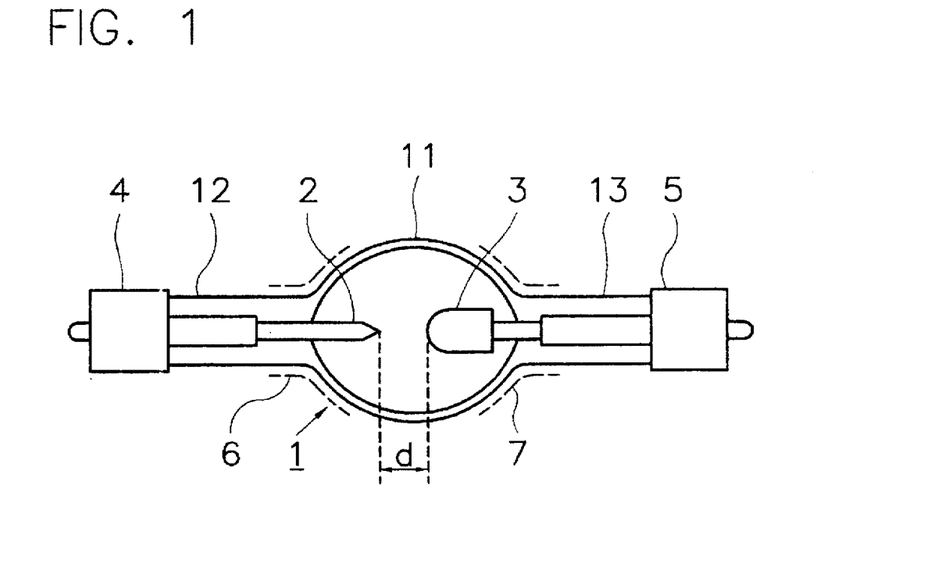
FIG. 1 is a schematic depiction of a cadmium discharge lamp of the short arc type.

FIG. 1 shows a specific arrangement of a cadmium discharge lamp of the short arc type according to the invention, which in the following is also called a "discharge lamp". In the figure, reference numeral 1 designates an arc tube which forms the discharge lamp and which is made of quartz glass. The arc tube 1 has a roughly oval emission envelope 11 in the middle, and hermetically sealed portions 12 and 13 formed on both ends.

Within emission envelope 11, there a cathode 2 and an anode 3 are closely positioned opposite each other with a distance of roughly 5 mm therebetween. The ends of hermetically sealed portions 12 and 13 are provided with bases 4 and 5 and heat insulation films 6 and 7 (represented as dashed lines) are applied to the outer surfaces of arc tube 1 in the root areas of cathode 2 and anode 3, such that the emergence of radiant light is not hindered. These heat insulation films regulate the temperature of the arc tube, and at the same time, keep the vapor pressure inside constant. These heat insulation films are formed, for example, of a metal oxide, with silicone resin as the main component.

The heat insulation films have the property that the temperature of the outside surface of arc tube 1 can be stabilized by the arrangement of the heat insulation films at a temperature of 850°±80° C., while the temperature would change within a range of 650°±100° C. without the heat insulation films.

Furthermore, temperature control of the arc tube is extraordinarily important in order to suitably maintain the density of the distribution number of cadmium atoms, ions and molecules which are in a ground state or an excited state, and the cadmium pressure in stationary lighting operation.

Furthermore, a double tube design or the like, in which there is an outer bulb in a peripheral area of arc tube 1, is used as the temperature control process.

In the description, cadmium in the state in which it is encapsulated in the arc tube, due to its solid state, is called "metallic cadmium", while cadmium in stationary lighting operation is called only "cadmium" because it is present as a vapor (gas). Furthermore, the term "stationary lighting operation" is used to mean a state in which, after the lamp has been put into operation by means of a starter, normally about 5 minutes later, the discharge voltage has reached a stationary state, i.e., the voltage has stabilized. A discharge lamp of this type is operated, for example, with a nominal wattage of 1 KW.

Figure 2:
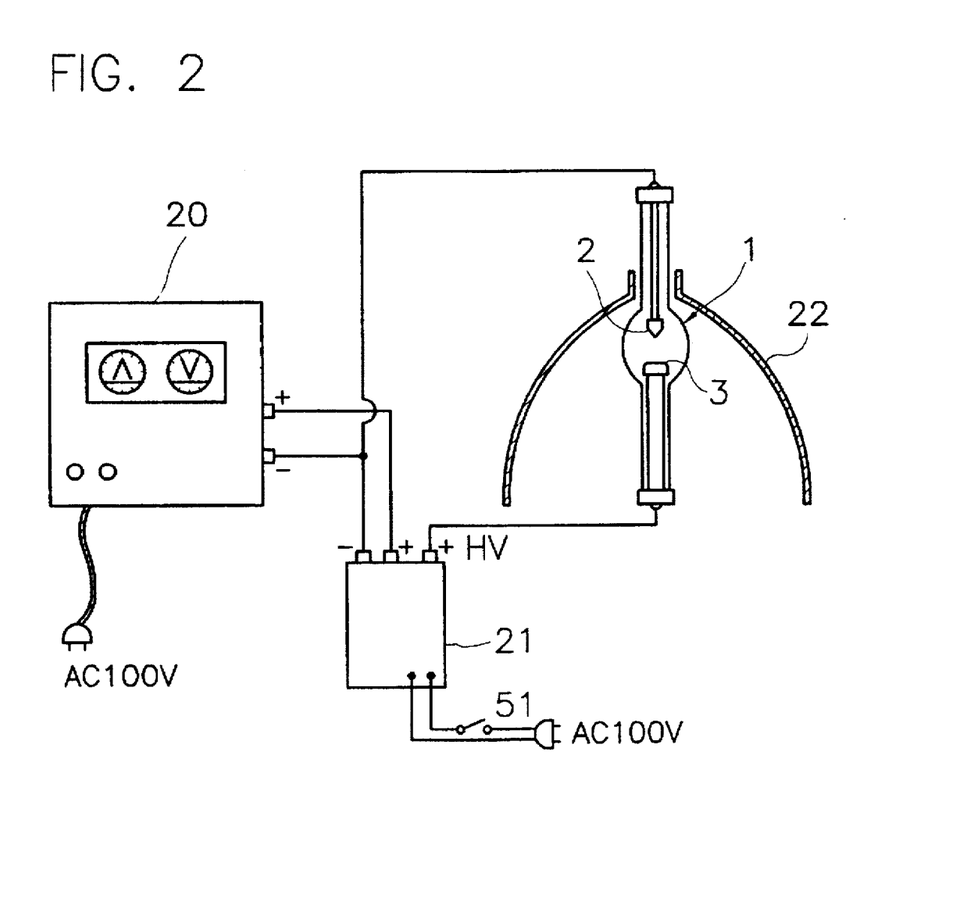
FIG. 2 shows a schematic of a circuit including a cadmium discharge lamp of the short arc type.

FIG. 2 shows a circuit powering the discharge lamp according to the invention. The circuit comprises a constant power supply 20 and a starter 21. The output current from constant power supply 20 is connected via starter 21 to discharge lamp 1 which is inserted into a focussing mirror 22. By closing switch S1 of starter 21, a high voltage is generated in starter 21 and by applying the voltage to anode 3 of discharge lamp 1 a dielectric sparkover of arc tube 1 is formed.

Then, by supplying current from constant power supply 20, an arc discharge is maintained. The light output is stabilized by regulating the output current from constant power supply 20.

Within emission envelope 11, metallic cadmium is encapsulated together with at least one of the rare gases xenon, krypton, argon or neon. This metallic cadmium is encapsulated such that its pressure in stationary lighting operation is in the range from 2 kPa to 13.7 kPa.

Here, it is conceivable that the luminous efficiency at a cadmium pressure in stationary lighting operation of greater than 13.7 kPa drops because, due to an excessively large amount of cadmium, the cadmium in the ground state increases in the arc formed between the electrodes, and because self-absorption is increased by the cadmium itself.

If, furthermore, the cadmium pressure in stationary lighting operation is less than 2.0 kPa, as a result of too little cadmium, the number of cadmium ions contributing to emission becomes too small. Consequently, the absolute emission intensity decreases.

Generally mercury is often encapsulated as an emission substance in a discharge lamp which emits ultraviolet rays. The discharge lamp according to the invention, however, has the characteristic that mercury is not used as an emission substance and that emission is produced substantially by the cadmium.

Furthermore, the rare gas is necessary to simplify starting of lighting operation of the discharge lamp. During stationary lighting operation, the emission is accomplished by cadmium, and the rare gas in itself does not contribute directly to emission. However, the rare gas performs a major function to stably maintain the arc temperature.

Figure 3:
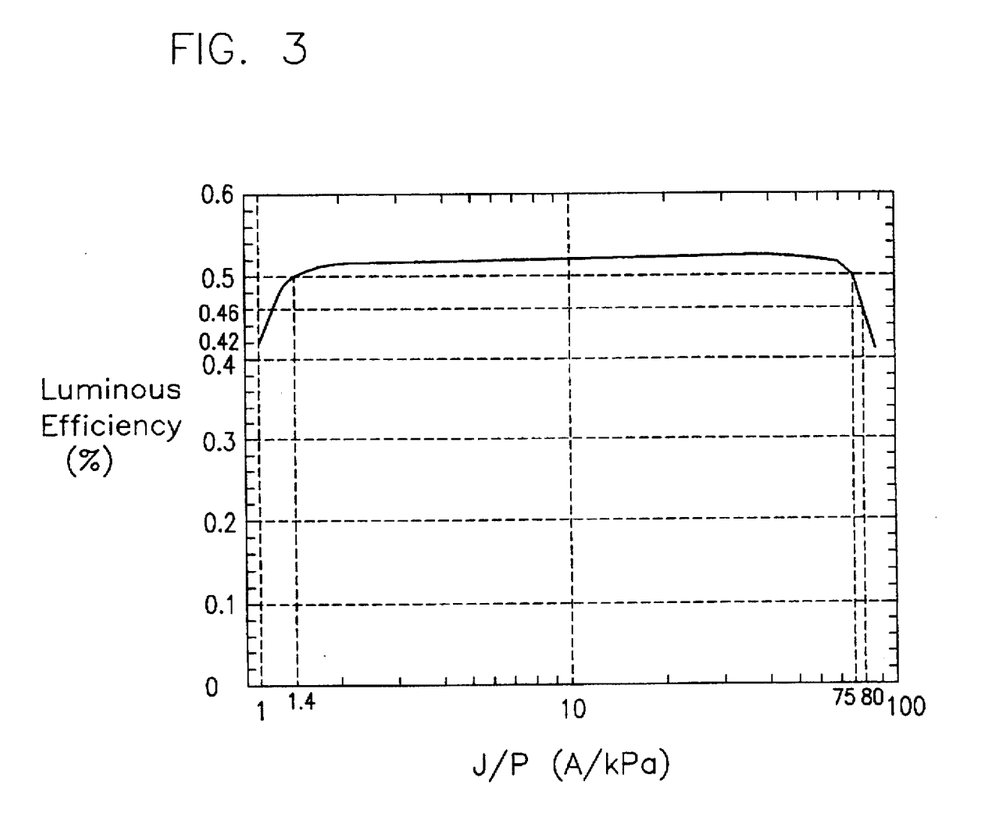
FIG. 3 shows a graph which plots the relationship between J/P and radiant efficiency at wavelengths of 214±2 nm.

Subsequently, a test was run in which the ratio between the value of J/P and the radiant efficiency was studied. FIG. 3 shows the result, the x-axis illustrating the value of J/P and the y-axis illustrating the radiant efficiency.

In the test, a lamp was produced in which krypton, as a rare gas, has been encapsulated and the radiant efficiency was measured at a wavelength of 214±2 nm for various values of J/P, the cadmium pressure in stationary lighting operation having been designated P (in kPa) and the current value in stationary lighting operation having been designated J (in amperes).

In this case, the expression "radiant efficiency η" is defined as the ratio between the irradiation of light with wavelengths of 214±2 nm and the input electric power into the lamp. Specifically, it designates a value at which the total amount Q of irradiation in the wavelength range from 212 nm to 216 nm is divided by the input electric power W (product of luminous voltage V and input electric current I).

It is apparent from this result that the radiant efficiency is stable if the value of J/P lies in the range between 1.4 and 75. However, it is also apparent that the radiant efficiency decreases acutely if the value of J/P is less than or equal to 1.4 or is greater than or equal to 75.

The rare gas is, furthermore, not limited to krypton, and essentially the same action could be obtained with xenon, argon, or neon.

Figure 4:
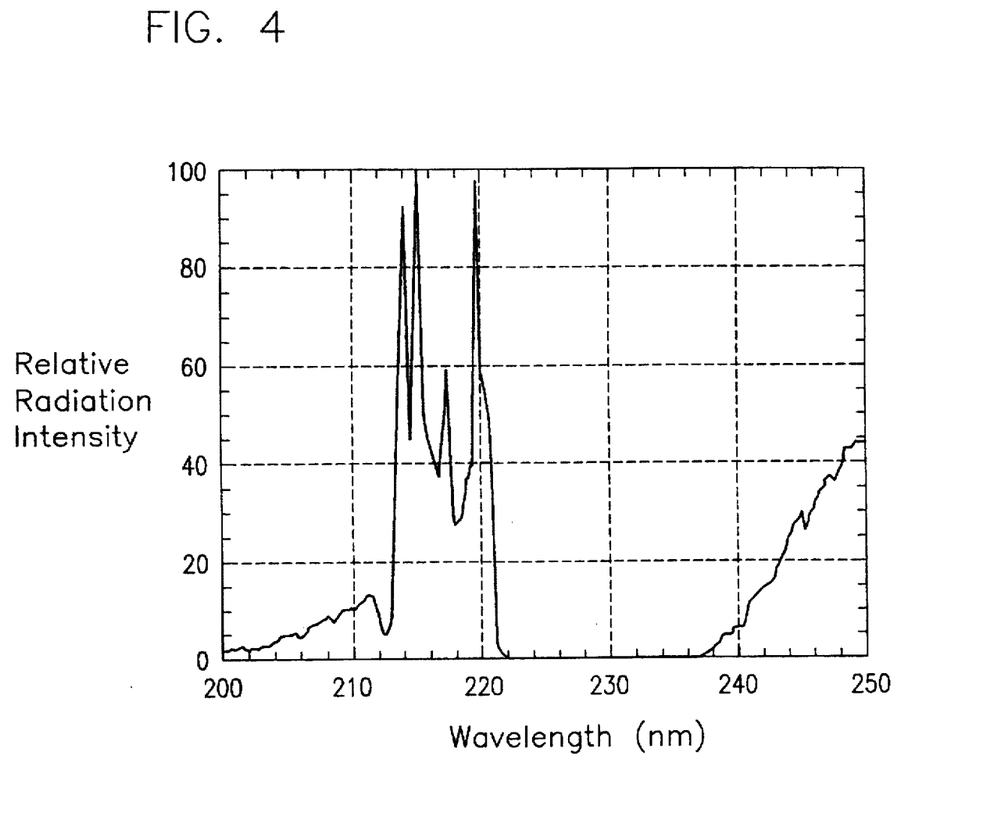
FIG. 4 shows a graph of the spectral distribution of emission spectra where J/P is 1.4.
Figure 5:
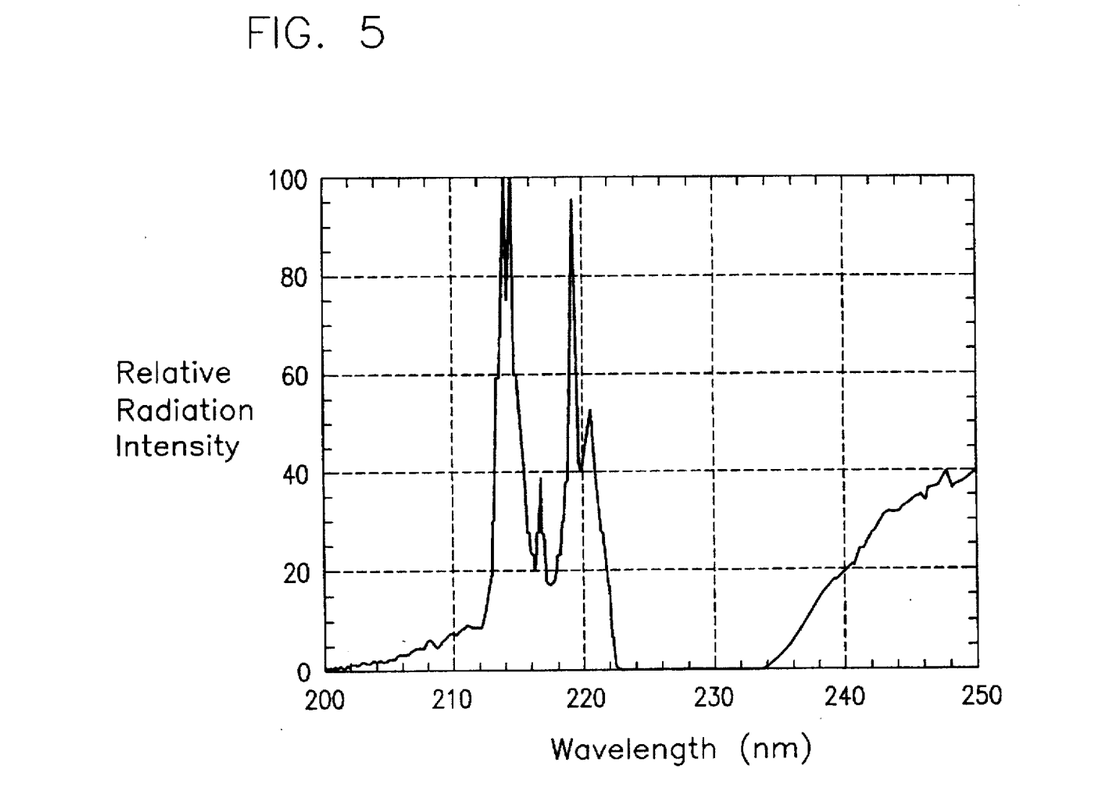
FIG. 5 shows a graph of the spectral distribution of emission spectra where J/P is 11.
Figure 6:
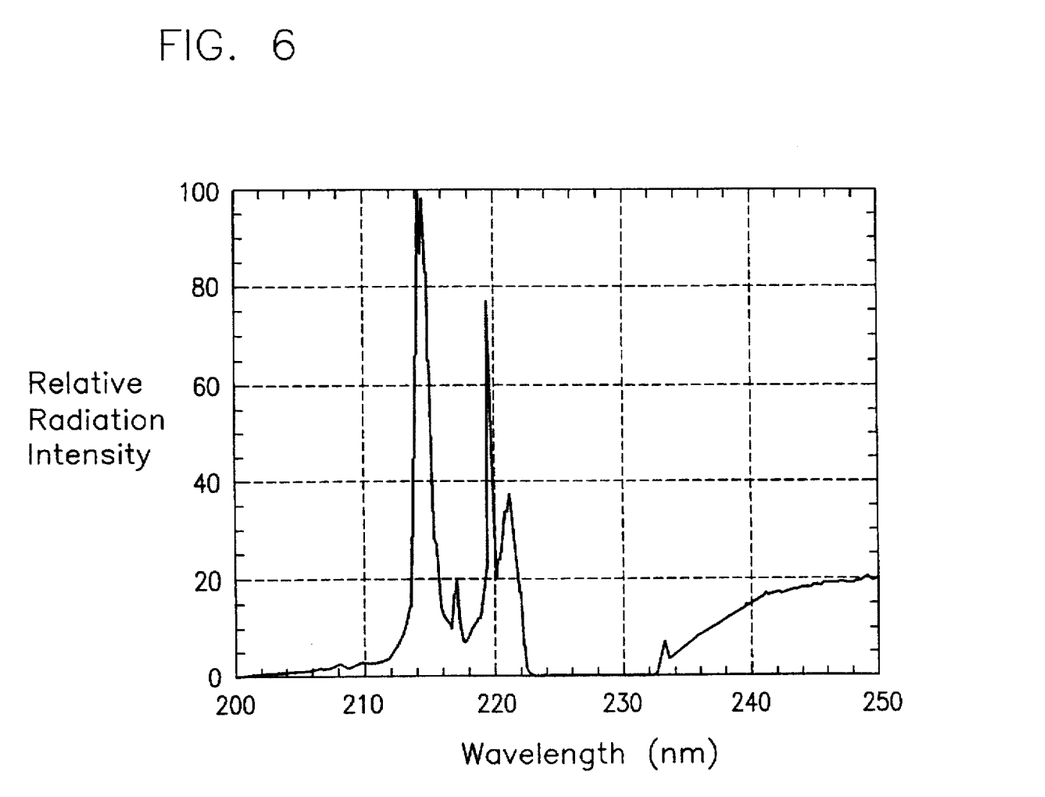
FIG. 6 shows a graph of the spectral distribution of emission spectra where J/P is 50.
Figure 7:
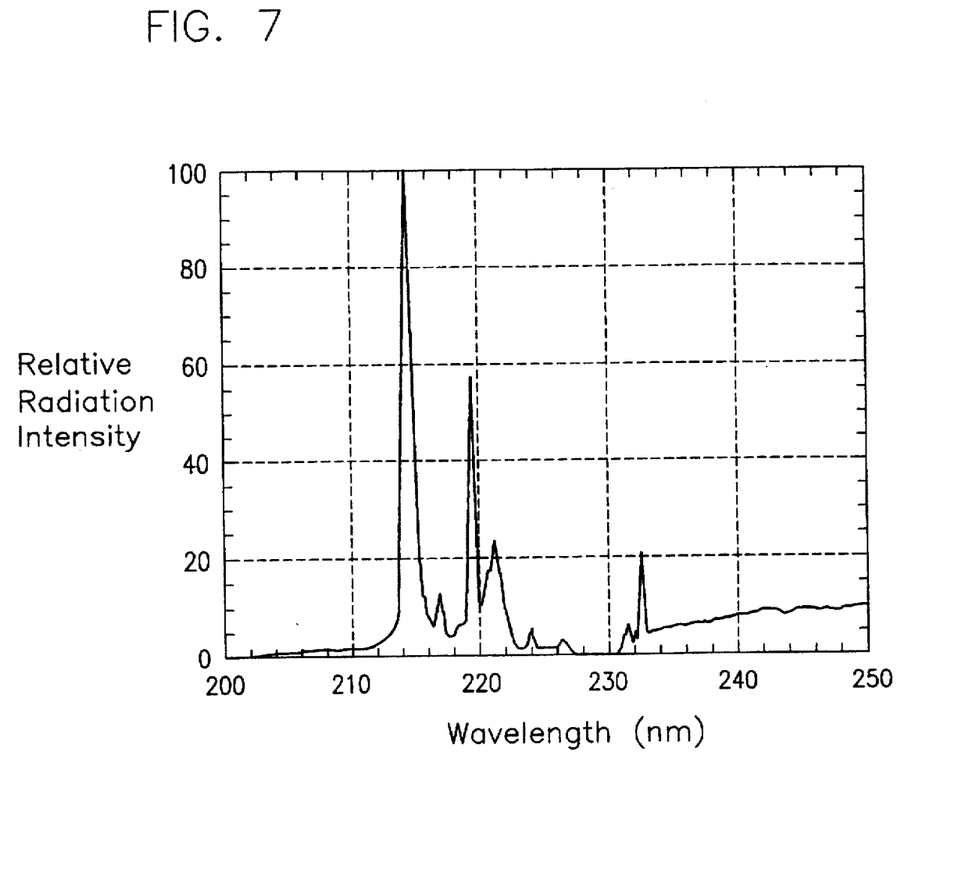
FIG. 7 shows a graph of the spectral distribution of emission spectra where J/P is 75.

Next, a test was run in which the ratio between the value of J/P and the emission spectra was studied. FIGS. 4 through 7 show the results, with FIG. 4 showing data for J/P of 1.4, FIG. 5 data for J/P of 11, FIG. 6 data for J/P of 50, and FIG. 7 data for J/P of 75, and with the y-axes illustrating the relative radiation intensity.

It becomes clear from these results that the spectral form exhibits major changes when J/P changes. However, it becomes apparent that a high radiation intensity is achieved at a wavelength of 214±2 nm, if J/P is 1.4, 11.0, 50.0 and 75.0.

Emission by cadmium is based on a subtle relative number of cadmium ions, atoms, molecules and electrons and is largely influenced by the value of J/P. However it becomes apparent that at wavelengths of 214±2 nm, line spectra with a small half-value width are emitted if J/P is at least in the range from 1.4 to 75.0.

The rare gas, furthermore, is not restricted to krypton, but essentially the same action could be obtained with xenon, argon, or neon.

Figure 8:
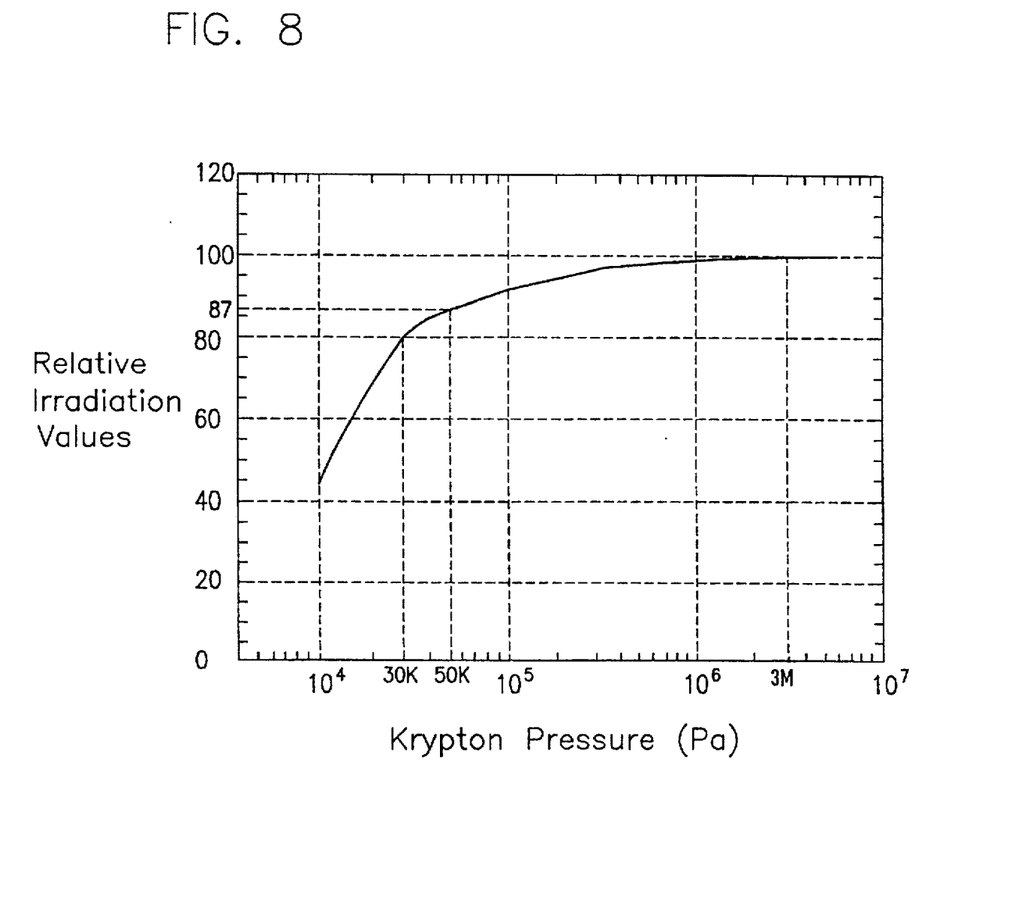
FIG. 8 shows a graph of the ratio between the encapsulation amount of the rare gas and the emission intensity of the light with wavelengths of 214±2 nm.

Next, a test was run in which the relationship of the encapsulation amount of the rare gas was studied. Specifically, krypton was encapsulated as the rare gas, its encapsulation amount was changed from 30 kPa to 4 MPa and the irradiation at wavelengths of 214±2 nm was measured. FIG. 8 shows the results, the y-axis illustrating the irradiation at wavelengths of 214±2 nm as relative values, by designating the irradiation for encapsulation of krypton of 3 MPa as 100. The x-axis illustrates the encapsulation amount of the krypton.

It becomes clear from the results plotted that the irradiation at an encapsulation amount of krypton of 30 kPa is roughly 80%, and that it decreases acutely at amounts less than or equal to 30 kPa. At an encapsulation amount of krypton of greater than or equal to 50 kPa sufficient irradiation is obtained.

Considering the danger of breakage of the arc tube in stationary lighting operation, it is furthermore desirable that the encapsulation amount of the rare gas be less than or equal to 3 MPa.

As is described above, the rare gas in stationary lighting operation is influenced by the temperature of the arc tube. Its encapsulation amount is therefore extremely important. A suitable encapsulation amount is in the range from 30 kPa to 3 MPa and is even more advantageous in the range from 50 kPa to 3 MPa.

The rare gas is furthermore not restricted to krypton, but essentially the same action could be obtained with xenon, argon, or neon.

As is described above, the discharge lamp according to the invention can accomplish line spectra emission with a small half-value width with wavelengths of 214±2 nm and can be used for different applications in which emission of this type is needed. Furthermore, when this discharge lamp is used as a light source of an optical microscope it was possible to increase the resolution up to 0.22 microns if $K_1$ was 0.6 and the numerical aperture NA was 0.58, as is described above.

Furthermore, according to the invention, as is apparent from the emission spectra shown in FIG. 4 through FIG. 7, besides light with a wavelength of 214 nm, intense light at a wavelength of 219 nm and in the area of this wavelength is emitted. Therefore, this wavelength can also be used according to the applications.

As is described above, in the discharge lamp according to the invention, the line spectra with wavelengths of 214±2 nm with high power can be emitted by the measure by which the metallic cadmium is encapsulated in the range from 2 kPa to 13.7 kPa and the lamp current is regulated such that the value of J/P is in the range from 1.4 to 75.

ACTION OF THE INVENTION

In the discharge lamp according to the invention, line spectra with wavelengths of 214±2 nm with high power can be emitted by the measure by which the metallic cadmium is encapsulated in the range from 2 kPa to 13.7 kPa and the lamp current is regulated such that the value of J/P is in the range from 1.4 to 75.

It can be commonly used as a light source of an optical high resolution microscope, for the light source of a semiconductor exposure device, for reforming of plastic surfaces, for photo-CVD, for ashing, and for UV curing, in which a certain wavelength is needed, and for similar purposes.

It is to be understood that although preferred embodiments of the invention have been described, various other embodiments and variations may occur to those skilled in the art. Any such other embodiments and variations which fall within the scope and spirit of the present invention are intended to be covered by the following claims.

What we claim is:

1. A short arc cadmium discharge lamp having a temperature-controlled arc tube which is provided with a pair of opposed, adjacently positioned electrodes, is encapsulated together with metallic cadmium and at least one of the rare gases xenon, krypton, argon and neon at a pressure in stationary lighting operation in the range from 2 kPa to less than 3 kPa, and a source of electrical power connected to said electrodes; wherein the cadmium is provided in a quantity coordinated to discharge current supplied by said source of electrical power in accordance with the relationship:

$$1.4 \leq J/P \leq 75$$

where J is the discharge current in stationary lighting operation in amperes and P is the cadmium pressure in stationary lighting operation in kPa.

2. Cadmium discharge lamp of the short arc type according to claim 1, wherein the rare gas is encapsulated in an amount resulting in a pressure thereof at room temperature which is in a range of from 30 kPa to 3 MPa.

3. Cadmium discharge lamp of the short arc type according to claim 1, wherein the arc tube contains no mercury which contributes significantly to emission of light therefrom.

4. A method of emitting light which has line spectra with wavelengths of 214±2 nm with high power from a cadmium discharge lamp comprising the steps of encapsulating within a temperature-controlled arc tube, a pair of opposed, adjacently positioned electrodes together with metallic cadmium and at least one of the rare gases xenon, krypton, argon and neon at a pressure in stationary lighting operation in the range from 2 kPa to less than 3 kPa; and operating the cadmium discharge lamp in accordance with the relationship:

$$1.4 \leq J/P \leq 75$$

where J is the discharge current supplied to the electrodes from a power source in stationary lighting operation in amperes, and P is a cadmium pressure produced from vaporization of the cadmium metal in stationary lighting operation in kPa.

* * * * *